United States Patent
Jansma

(10) Patent No.: US 8,723,653 B2
(45) Date of Patent: May 13, 2014

(54) ASSET IDENTIFICATION AND MANAGEMENT METHOD AND SYSTEM

(75) Inventor: Michael Jansma, Eureka, MO (US)

(73) Assignee: Schneider Electric IT Corporation, West Kingston, RI (US)

( * ) Notice: Subject to any disclaimer, the term of this patent is extended or adjusted under 35 U.S.C. 154(b) by 578 days.

(21) Appl. No.: 12/788,589

(22) Filed: May 27, 2010

(65) Prior Publication Data

US 2011/0291813 A1 Dec. 1, 2011

(51) Int. Cl.
*H04Q 5/22* (2006.01)
*G08B 21/00* (2006.01)
*G05B 19/00* (2006.01)
*H02H 3/08* (2006.01)

(52) U.S. Cl.
USPC ......... 340/10.5; 340/664; 340/5.61; 361/93.1

(58) Field of Classification Search
CPC ....... G06F 1/26; G06F 11/3062; H01R 13/46; G06K 7/06
See application file for complete search history.

(56) References Cited

U.S. PATENT DOCUMENTS

| | | | |
|---|---|---|---|
| 5,910,776 A | 6/1999 | Black | |
| 6,150,921 A | 11/2000 | Werb et al. | |
| 6,784,802 B1 | 8/2004 | Stanescu | |
| 6,903,656 B1 | 6/2005 | Lee | |
| 2002/0169914 A1 | 11/2002 | Shteyn | |
| 2002/0190845 A1 | 12/2002 | Moore | |
| 2003/0141962 A1 | 7/2003 | Barink | |
| 2003/0174099 A1 | 9/2003 | Bauer et al. | |
| 2005/0138439 A1 | 6/2005 | Rothman et al. | |
| 2005/0184856 A1* | 8/2005 | Pourchot | 340/5.61 |
| 2005/0203987 A1 | 9/2005 | Ewing et al. | |
| 2005/0237194 A1 | 10/2005 | VoBa | |
| 2005/0246436 A1 | 11/2005 | Day et al. | |
| 2005/0280970 A1* | 12/2005 | Reynolds | 361/93.1 |
| 2006/0072271 A1* | 4/2006 | Jones et al. | 361/93.1 |
| 2006/0148279 A1 | 7/2006 | German et al. | |
| 2006/0167624 A1 | 7/2006 | Whalley et al. | |

(Continued)

FOREIGN PATENT DOCUMENTS

| | | |
|---|---|---|
| CN | 1636355 A | 7/2005 |
| CN | 101315710 A | 12/2008 |

(Continued)

OTHER PUBLICATIONS

International Search Report for PCT/US2011/038104 mailed Oct. 12, 2011.

(Continued)

*Primary Examiner* — Steven Lim
*Assistant Examiner* — Omeed Alizada
(74) *Attorney, Agent, or Firm* — Lando & Anastasi, LLP

(57) ABSTRACT

A power distribution apparatus includes a reader, one or more electrical outlets, and one or more antennas mounted in proximate relation to one or more of the electrical outlets. An asset includes a power cord having a transponder attached thereto, and the power cord may be coupled to one of the electrical outlets. A method for identifying and managing an asset includes mounting the power distribution apparatus in an equipment rack, reading, by the reader through one or more of the antennas, identification data contained in the transponder, communicating information including the identification data through a network to a controller, and determining, by the controller, a control action based on the information.

14 Claims, 5 Drawing Sheets

(56) References Cited

U.S. PATENT DOCUMENTS

| | | | |
|---|---|---|---|
| 2006/0267772 A1* | 11/2006 | Knadle et al. | 340/572.4 |
| 2008/0100456 A1 | 5/2008 | Downie et al. | |
| 2009/0027202 A1 | 1/2009 | Copeland et al. | |
| 2009/0096581 A1 | 4/2009 | Macauley et al. | |
| 2009/0108995 A1 | 4/2009 | Tucker et al. | |
| 2009/0207022 A1 | 8/2009 | Reckeweg et al. | |
| 2011/0208450 A1* | 8/2011 | Salka et al. | 702/62 |
| 2011/0248823 A1* | 10/2011 | Silberbauer et al. | 340/10.1 |

FOREIGN PATENT DOCUMENTS

| | | |
|---|---|---|
| CN | 202383720 U | 8/2012 |
| DE | 102006030077 A1 | 1/2008 |
| DE | 102007022906 B3 | 8/2008 |
| EP | 1 545 050 A2 | 6/2005 |
| EP | 1713145 A1 | 10/2006 |
| GB | 2 383 708 A | 7/2003 |
| JP | 2007088957 A | 4/2007 |
| WO | 02091680 A2 | 11/2002 |
| WO | 2009/097400 A1 | 8/2009 |

OTHER PUBLICATIONS

Server Technology Inc.: "Sentry: Cabinet Power Distribution Unit (CDU)", Sep. 1, 2009, XP55007984, Retrieved from the Interent: URL:http://ww.servertech.com/uploads/documents/0000/0590/CDU_family_comparison_high_end.pdf [retrieved on Sep. 23, 2011].

Wikipedia: "Power distribution unit", Internet Article, Mar. 31, 2010, XP002660037, Retrieved from the Internet: URL:http://en.wikipedia.org/w/index.php?title=Power_distribution_unit&oldid=353063312 [retrieved on Sep. 23, 2011].

"Designing an Antenna for the M24LR64-R Dual Interface IC/RFID Device". AN2972 Application Note, Stmicroelectronics. Doc ID 15629 Rev 5. Feb. 1, 2010 pp. 1-23.

International Preliminary Report on Patentability for PCT/US2011/038104 dated Aug. 22, 2012.

Written Opinion of the International Preliminary Examining Authority for PCT/US2011/038104 mailed May 30, 2012.

Chinese Search Report from corresponding Application No. 201110141945.1 mailed Sep. 30, 2013.

* cited by examiner

ASSET IDENTIFICATION AND MANAGEMENT METHOD AND SYSTEM

BACKGROUND OF INVENTION

1. Field of Invention

The present disclosure relates generally to the field of asset identification and management, and more particularly to methods and systems for identifying and managing equipment having transponders attached to the power cords thereof.

2. Discussion of Related Art

Data centers may contain thousands of physical information technology (IT) assets (e.g., servers, switches) deployed and maintained across large installation sites, including data centers and electrical equipment rooms. Many installation sites have assets that are regularly added and removed for maintenance, replacement and/or upgrade purposes. In many regions, legal and regulatory requirements, such as the Sarbanes-Oxley Act in the United States, require accurate inventory tracking of IT assets. Traditionally, this has entailed the onerous task of taking physical inventory of each piece of IT equipment on at least a regular basis. Many solutions to this task have been developed, including attaching bar code tags or RFID tags to each asset and reading the tags for inventory purposes either at an entry/exit point to the data center space, or via handheld or rack-mounted tag readers. These solutions are limited to reading tags in a local environment by personnel authorized to access the equipment.

Additionally, many installation sites use switched rack power distribution units (PDUs) to provide individual control of electrical outlets for managing the power requirements of installed IT assets. Using existing techniques, users typically keep manual records or manually enter equipment associations (i.e., associating a specific IT asset with a specific PDU outlet) to utilize the management functions of the PDUs. These techniques are subject to entry errors or obsolete information when equipment is moved and the records are not promptly updated.

In a former approach, RFID tags or manual methods (i.e., bar coding or manually recording tag numbers) are used to inventory physical assets. Using existing RFID techniques, an accurate inventory may be established. However, these techniques do not associate physical assets with power connectivity (i.e., the outlet, branch circuit, PDU, or UPS that feeds power to the device), and in some cases, the physical rack location of the asset cannot be identified using the tag information alone. Further, when new assets are added to switched rack PDUs, users must manually associate the physical asset with the electrical outlet(s) feeding each device to establish a connectivity map (or power path) for power control. If device(s) are moved to other electrical outlets or physical locations, the user must manually update the power associations in the rack PDU(s) to ensure the equipment is associated with the new power feed path. The existing methods are subject to human error including potential consequences such as accidentally removing power, circuit overloading, and other undesirable events.

SUMMARY OF INVENTION

Various embodiments of the present disclosure automate the tasks of identifying physical assets, and associating the assets with individual power outlets to significantly reduce the work of setting up, mapping, and maintaining power connectivity of the assets within the installation site. In one example, an asset is tagged and logged into central database or management system only once initially.

Other embodiments include an active method to poll power connected assets at the installation site for continuous, real-time, and accurate inventorying of equipment. Further embodiments include methods and systems for tracking asset locations, for example, by equipment rack location and by specific power outlet location.

According to one embodiment, a method for identifying and managing an asset comprises mounting a power distribution apparatus in an equipment rack, the power distribution apparatus including a reader; reading, by the reader through one or more antennas coupled to the reader, identification data contained in a transponder attached to a power cord of the asset, each of the one or more antennas being mounted in proximate relation to one or more electrical outlets in the power distribution apparatus, the power cord being coupled to one of the one or more electrical outlets; communicating information including the identification data through a network to a controller; and determining, by the controller, a control action based on the information.

The method may further comprise determining, by the controller, a reporting action based on the information.

The method may further comprise communicating the control action through the network to the power distribution apparatus and controlling the one or more electrical outlets based on the control action.

The method may further comprise comparing the information to a database of assets to identify and/or locate the asset, wherein the controller includes the database of assets. The method may further comprise maintaining an inventory including the asset based on the information.

The method may further comprise selectively enabling one of the antennas to enable the reader to read the transponder.

The method may further comprise communicating a user control action through the network to the power distribution apparatus, and controlling the one or more electrical outlets based on the user control action.

The reader may include an RFID reader, and the transponder may include an RFID tag. The power cord may have a plug attached to an end of the power cord, and the transponder may be attached to the plug.

According to another embodiment, a power distribution apparatus comprises a power input to receive input power from a power source, a plurality of electrical outlets coupled to the power input, a reader coupled to one or more antennas each constructed and arranged to be mounted in proximate relation to one or more of the plurality of electrical outlets, a communication device coupled to the reader, and a controller coupled to the communication device. The reader is configured to read, through one of the antennas, identification data contained in a transponder attached to a power cord of an asset, the power cord being coupled to one of the one or more electrical outlets. The communication device is operative to communicate information including the identification data between the reader and the controller. The controller is operative to determine a control action based on the information.

The controller may include a database of assets to identify and/or locate the asset based on the information.

The reader may include an RFID reader, and the transponder may include an RFID tag.

The power cord may have a plug attached to an end of the power cord, and the transponder may be attached to the plug. The power cord may be permanently coupled to the asset or detachably coupled to the asset.

The identification data may be factory programmable and/or user programmable.

The system may further comprise an antenna selector coupled to each of the antennas to selectively enable one of the antennas to enable the reader to read the transponder.

According to yet another embodiment, an asset identification and management system comprises one or more antennas each mounted in proximate relation to one or more electrical outlets in a power distribution apparatus, a controller operatively coupled to the power distribution apparatus, means, coupled to each of the one or more antennas, for reading identification data contained in a transponder attached to a power cord of an asset, power cord being coupled to one of the one or more electrical outlets, and means for communicating information including the identification data between the power distribution apparatus and the controller, wherein the system is configured to control the electrical outlets based on the information.

The system may further comprise means for identifying and/or locating an asset. The system may further comprise means for associating the asset with the one of the one or more electrical outlets. The system may further comprise means for managing a power load of the asset and/or a power consumption of the asset. The system may further comprise means for maintaining an inventory including the asset.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
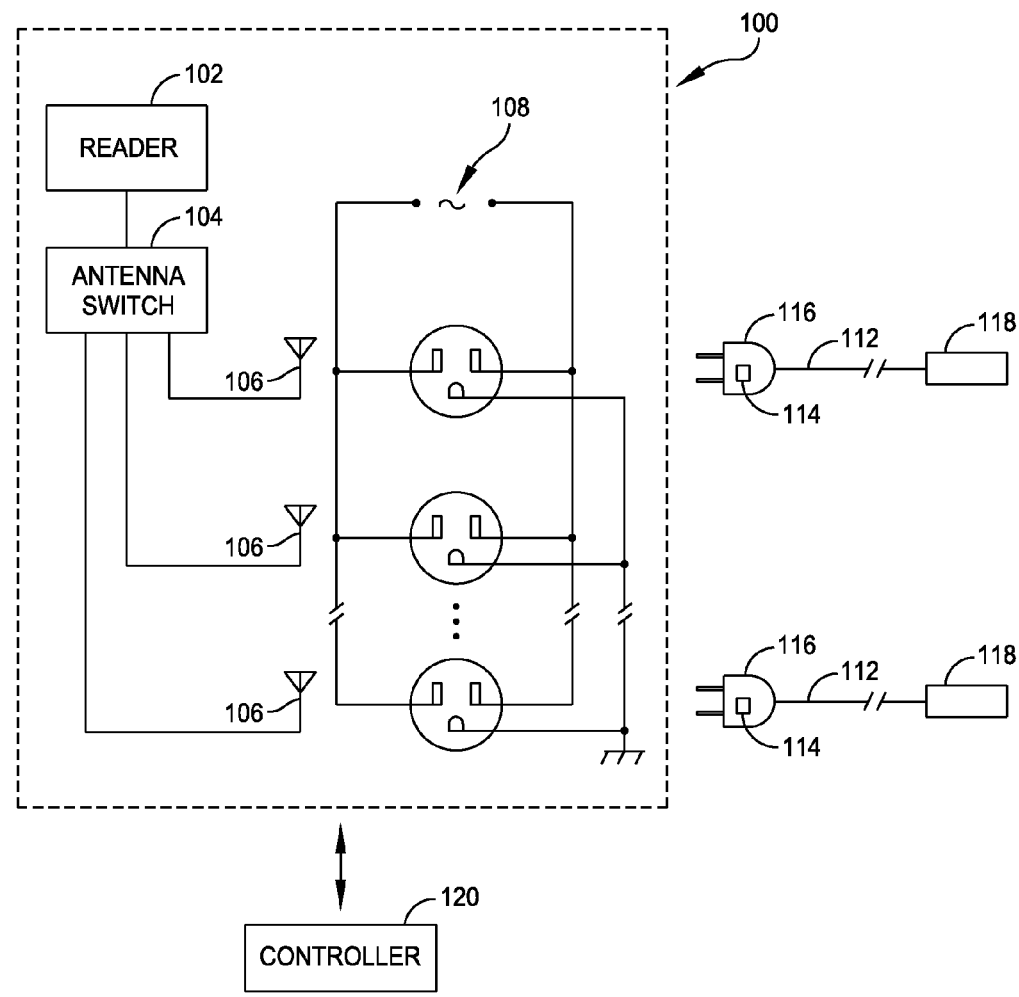
FIG. 1 illustrates a schematic diagram of an exemplary system for identifying and managing an asset in accordance with one embodiment of the present disclosure.

Embodiments of this invention are not limited in their application to the details of construction and the arrangement of components set forth in the following description or illustrated in the drawings. Embodiments of the invention are capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Asset inventory and management systems are used in many organizations to track and control information technology resources in both centralized and distributed installations. Many companies house servers, telecommunications equipment and the like in a myriad of equipment racks within their data centers. Inventory of these assets may be accomplished, for example, through the use of multiple bar code or RFID readers permanently (or semi-permanently) located at various asset locations and tied into a network. In this manner assets may be tracked remotely as they are installed or removed; however, at large installations the cost of providing and maintaining many such readers may become prohibitively high. Furthermore, care should be taken to ensure that the readers are configured to read each asset as it is installed or removed to avoid the problem of assets being "lost" as a result of their placement outside of reader range or any undetected movement. If the nature of asset locations is disparate (e.g., if assets are installed at locations not covered by the reader), identification and tracking of assets is, in certain instances, not possible using these methods and devices.

According to one embodiment, an RFID tag may be used to identify an asset based on identifying information (e.g., asset identifying information, properties of the asset, or power requirements of the asset) contained in the RFID tag. The identifying information may be preset at the factory, or it may be user-defined (e.g., in a user-programmable RFID tag). The RFID tag may be attached to a power cord of the asset. The power cord may be permanently attached to the asset, or detachably coupled to the asset. When the power cord is coupled to an electrical outlet (e.g., a wall outlet, a power strip, or a rack power distribution unit) having an RFID reader, the reader may read the identifying information from the RFID tag and may further communicate the information to an upstream network device or controller. The electrical outlet (or the power distribution unit) may optionally include a load relay, a power load and consumption meter, a network communication interface, information including the power measurement, and an outlet control status (e.g., a relay or a circuit breaker status).

According to another embodiment, the upstream network device or controller may use the identifying information to compare against properties of the asset in a database, or in a user-programmed set of control commands. The properties may include, for example, a set of control actions, access permissions, load availability, and billing data. The network device or controller may send a control command back to an electrical outlet to take an action (e.g., enable power to the asset, indicate a network alarm to others, turn on outlet, turn off outlet, set voltage, and set power properties) based on database properties and/or a pre-defined control scheme. The network device or controller may log the data to a database or other storage device, and may track and send the information regarding the asset (e.g., properties, status, and load) to other devices for uses such as billing, asset management, power control, and asset traceability.

In yet another embodiment, a user may use, for example, a centralized management console to identify the asset and take controlling actions based upon the information read from the RFID tag and other asset information that may be communicated to the network device or controller.

Figure 2:
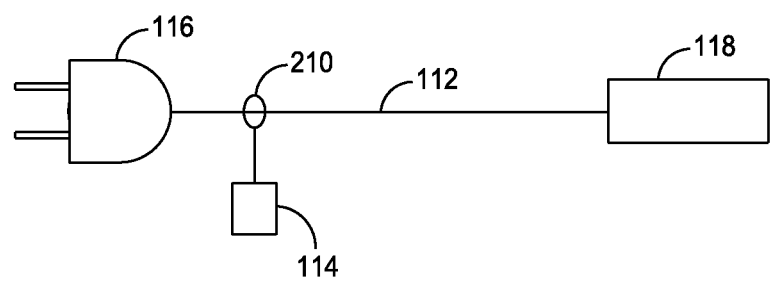
FIG. 2 illustrates a schematic diagram of an exemplary power cord having a transponder attached thereto in accordance with one embodiment of the present disclosure.

FIG. 1 shows an exemplary asset identification and management system in accordance with one embodiment of the present disclosure. A power distribution unit (PDU) 100 includes a reader 102, an optional antenna switch 104, a plurality of antennas 106, a power supply 108, and a plurality of electrical outlets 110. Also shown in FIG. 1 are exemplary power cords 112 each having a transponder 114 attached thereto. Each power cord may be attached to an asset 118. As shown in FIG. 1, each power cord 112 has a plug 116 attached to one end of the power cord 112, and the transponder 114 is attached to the plug 116. The transponder 114 may be attached to the plug 116, for example, by using a fastener (e.g., adhesive or hook-and-loop), or the transponder 114 may be embedded within the plug 116 (e.g., during manufacture or by design). The plug 116 may, for example, conform to an industry standard, such as IEC320 C13 or C19, or Nema 5-15P, 5-20P, or L5-20P. However, it will be understood that the transponder 114 may be attached to the power cord 112 in other ways or to other portions of the power cord 112. For example, as shown in FIG. 2, the transponder 114 may be attached to the power cord 112 by a tether 210 or other attachment device. It will also be understood that the number of antennas 106, outlets 110, and power cords 112 may vary according to the particular application and the number of assets 118.

According to one embodiment, the PDU 100 is coupled to a controller 120. The PDU 100 may be, for example, a switched rack PDU, such as Model Number AP7900 sold by American Power Conversion Corporation (APC). Such switched rack PDUs may provide, for example, load metering, remotely controlled on/off switching of individual outlets, delayed power sequencing of equipment and outlet use management, usually through a network interface with the controller 120. In one example, the controller 120 may be an automated centralized data center configuration and control manager, such as InfraStruXure® Central Server, Model Number AP9475, also sold by APC. In another example, the controller 120 may include one or more devices, interconnected through a network, of a distributed processing system configured to manage IT assets.

According to one embodiment, the reader 102 is coupled to each of the antennas 106. Each antenna 106 may be mounted in proximate relation to one or more of the outlets 110. In one example, each outlet 110 may have an antenna 106 mounted in proximate relation thereto. In another example, one antenna 106 may be mounted in proximate relation to a group of two or more outlets 110.

In one embodiment, each antenna 106 is mounted such that when a power cord 112 is coupled to one of the outlets 110, the transponder 114 is within a reading range of antenna 106. It will be understood that the antenna 112 may be mounted, for example, next to, around, above or below the outlet 110. Accordingly, the reader 102 may, for example, read the transponder 114 when the power cord 112 is coupled to the outlet 110. In another example, the reader 102 may read the transponder 114 when the power cord 112 is placed near enough to the outlet 110 such that the antenna 106 is within the reading range of the transponder 114, even though the power cord 112 is not coupled to the outlet 110. In another embodiment, where the power cord 112 includes the plug 116 and transponder 114 attached thereto, the antenna 106 may be constructed and arranged such that the transponder 114 is within reading range of the antenna 106 only when the plug 116 is coupled to the outlet 110.

According to another embodiment, an antenna switch 104 is coupled to each of the antennas 106. The antenna switch 104 may also be coupled to the reader 102, or to another device (not shown) configured to be coupled to the antenna switch 104. The antenna switch 104 may selectively enable the reader 104 to read a transponder 114 through one of the antennas 106 at a time, which allows the reader 102 to read multiple transponders 114 through different antennas 106. The antenna switch 104 may be controlled and/or monitored by the reader 102 or another device, to control and/or monitor which antenna 106 is enabled. Information including an identification of the enabled antenna 106, and the corresponding outlet 110, may be used in part to identify a location of the asset 118 depending on which outlet 110 the power cord 112 of the asset 118 is coupled to. It will be understood that the antenna switch 104 shown in FIG. 1 is exemplary, and that the reader 102 may be directly coupled to one or more of the antennas 106. Furthermore, the antenna switch 104 may be coupled to antennas constructed and arranged to be enabled and disabled by the antenna switch 104.

According to one embodiment, the transponder 114 is an RFID tag associated with the asset 118 for uniquely identifying the respective asset. When power cord 112 of the asset 118 is coupled to an outlet 110, the RFID tag enters into the reading range of the antenna 106 mounted at or near the outlet 110 to which the power cord 112 is coupled. The antenna 106 will then receive a signal emitted by the RFID tag. It will be appreciated that the RFID tag may be passive or battery assisted passive, and accordingly power may be applied to the antenna 106, for example by the reader 102, to provoke the RFID tag to emit a signal. If the RFID tag is active, the power may not be necessary.

According to another embodiment, the reader 102 includes an RFID reader (not designated), for example a TRH031M integrated circuit (IC) chip, available from 3ALogics, or a similar device. The RFID reader extracts and processes identification data contained in the signal received from the RFID tag, which data may include an RFID tag identifier, an asset identifier, and other information relating to the respective asset.

In one embodiment, the identification data extracted from the signal by the reader 102 is communicated to the controller 120 by the reader 102. The data may include, but not be limited to, transponder identification, asset identification, asset property information, and asset location information. The data may be used by the controller 120 to, for example, identify, locate, monitor, track, and/or inventory the asset 118.

According to another embodiment, information, which may include the identification data, is communicated by the PDU 100 to the controller 120. In one example, the data includes RFID tag identification, rack identification, and rack position based on the antenna location, which the controller 120 may use to identify and locate the corresponding asset. In another example, the controller 120 may poll the reader 102 or the PDU 100 for stored or real-time data.

According to yet another embodiment, the reader 102 is capable of reading one transponder 114 at a time. However, the reader 102 may be connected to multiple antennas 106. To ensure that only one transponder signal reaches the reader 102 at any given moment, each antenna 106 may be individually enabled by the antenna switch 104. When the antenna 106 is enabled, the signal (if any) received by the antenna 106 is communicated to the reader 102. When the antenna 106 is not enabled, the signal (if any) is inhibited from reaching the reader 102.

The antenna switch 104 may, for example, operate independently by having an integral logic component for selecting the antennas 106 according to a programmable scheme. The scheme may, for example, include briefly enabling each antenna 106 in a circular or pre-determined pattern. In another embodiment, the reader 102 or controller 120 commands the antenna switch 104 to enable a particular antenna 106. It should be appreciated that other configurations and modes of antenna selection are possible when using a reader 102 capable of reading more than one transponder 114 at a time.

To coordinate the enabling and receiving of signals from each antenna 106, the reader 102 or controller 120 may, for example, direct the antenna switch 104 to enable one of the antennas 106 at a time. After a received signal is acquired by the reader 102 from the enabled antenna 106, the reader 102 or controller 120 may then direct the antenna switch 104 to enable individually each of the other antennas 106. This pattern of enabling one antenna 106 at a time allows the reader 102 to acquire, over time, the signal of all antennas 106, and the pattern may be repeated in a "scanning" fashion, wherein each scan includes enabling some or all of the antennas 106. The total time required for a single scan may be one second or less, allowing the reader 102 or controller 120 to rapidly poll each of the antennas 106 in a repetitive manner.

Because the reader 102 or controller 120 is therefore aware of which antenna 106 is enabled at any given time, the controller 120 is also capable of identifying which antenna 106 is currently providing the signal (if any) being received by the reader 102. By using information about the asset 118 contained in the signal received by the reader 102 in conjunction with the antenna identification, the controller 120 can correlate a location of the asset with the particular location associated with the antenna 106, for example, by using data in a database containing a listing of the antennas 106 and their locations. Furthermore, the absence of any signal (e.g., due to no transponder 114 being present with the reading range of the enabled antenna 106) may indicate that no asset is currently being powered from a particular outlet 110.

According to another embodiment, the PDU 100 is configured to meter or measure a current flow at each of the outlets 110. Accordingly, the PDU 100 may detect the presence of the asset 118 coupled to one of the outlets 110 when the asset 118 is drawing power from the outlet 110. The reader 102 or controller 120 may direct the antenna switch 104 to enable the antenna 106 mounted within the reading range of the transponder 114 associated with the asset 118 to read the transponder 114. In another embodiment, the reader 102 or controller 120 may direct the antenna switch 104 to enable individually each of the antennas 106, for example, in a "scanning" fashion, substantially as described above.

In another embodiment, the PDU 100 may detect a change in the current flow at one or more of the outlets 110, and upon said detection enable one or more antennas 106 substantially as described above.

Figure 3:
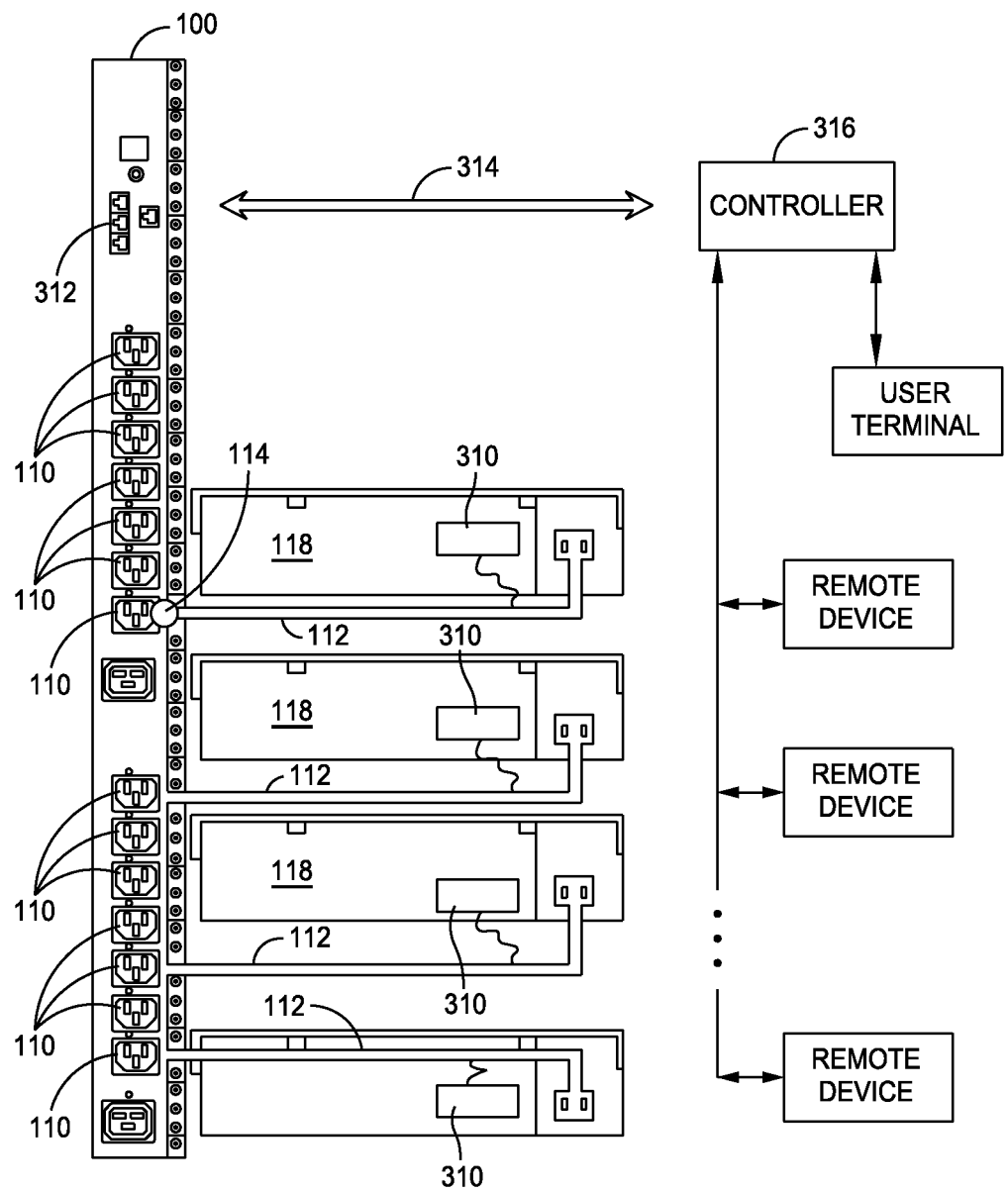
FIG. 3 illustrates an exemplary system for identifying and managing an asset in accordance with one embodiment of the present disclosure.

FIG. 3 shows an exemplary asset identification and management system in accordance with one embodiment of the present disclosure. A power distribution unit 100 includes a plurality of electrical outlets 110 and a network interface 312. The power distribution unit 100 may also include a reader (not shown), an optional antenna switch (not shown), a plurality of antennas (not shown), a power supply (not shown), and a communication device (not shown). Shown further in FIG. 3 are several assets 118, each having a power cord 112, a transponder 114 attached to the power cord 112, and, optionally, at least one tag 310 attached to the asset 118. The optional tag 310 may be an identification device, such as an optical tag or RFID transponder, separate and unique from the transponder 114 attached to the power cord 112. Additionally, a controller 316, at least one user terminal 318, and one or more remote devices 320 are shown. In another embodiment, the PDU 100 is mounted in an equipment rack.

According to one embodiment, the tag 310 are associated with the asset 118, and the transponder 114 is "matched" with the tag 310, thereby providing two separate yet consistent identification methods for identifying the asset 118. This matching may, for example, be accomplished by using a tag 310 and a transponder 114 each containing identical or substantially similar identification data, whereby the identification data in either the tag 310 or transponder 114 is useable to identify the asset 118. In another example, the tag 310 and transponder 114 may contain different identification data, in which case the matching may be accomplished by comparing the data in either the tag 310 or the transponder 114 against an inventory or database of assets containing the corresponding identification data.

According to yet another embodiment, the power distribution unit 100 exchanges information with the controller 120 over, for example, a network 314 coupled to the network interface 312. The information may include, for example, asset identifying information, properties of the asset, or power requirements of the asset. The information may also include, for example, a control command to be sent back to the power distribution unit 100 to take an action (e.g., allow load, indicate a network alarm to others, turn on outlet, turn off outlet, set voltage, and set power properties). In turn, the controller 316 may use the information to perform various asset management tasks, for example, identifying a newly installed asset, reporting a newly removed asset, reporting the location of an asset, reporting "unidentified" assets (e.g., those with no transponders) or unrecognized assets, and determining a reporting action regarding the asset. Other examples of asset management tasks include mapping a power path to the asset, determining a control action regarding the asset, and controlling the power to the asset, including power capacity management functions such as power optimization and rationing.

In one embodiment, the controller 316 interfaces with other devices including at least one user terminal 318. The user terminal 318 may be used, for example, to configure, control and monitor the assets 118 through one or more software tools on the controller 316, such as the InfraStruXure® Central Server described above. Additionally, the controller 316 may, for example, be configured to communicate information with one or more remote devices 320 for uses such as billing, asset inventory, asset and/or power utilization, and asset and/or power control.

Figure 4:
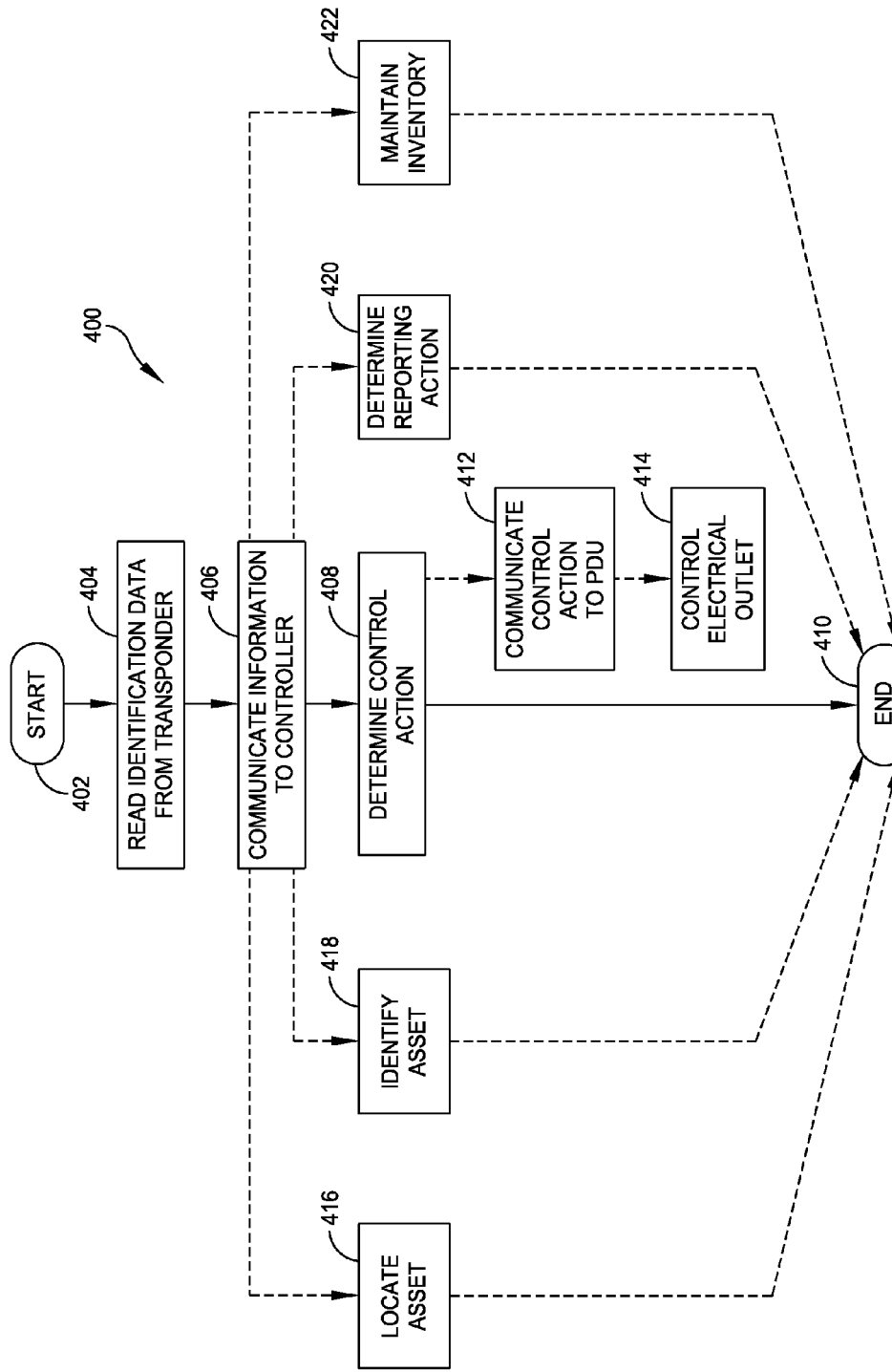
FIG. 4 illustrates an exemplary process for identifying and managing an asset in accordance with one embodiment of the present disclosure.

FIG. 4 depicts an exemplary process 400 for identifying and managing an asset in accordance with one embodiment of the present disclosure. At block 402, the process begins. At block 404, identification data is read from a transponder. The transponder may be read using a reader constructed and arranged to be mounted in proximate relation to one or more electrical outlets of a PDU mounted in an equipment rack. For example, the transponder may be an RFID tag and the reader may be an RFID reader configured to read the identification data from the RFID tag when the RFID tag is placed within a reading range of the reader. In one embodiment, the transponder may be attached to a power cord of an asset, and the reader may be arranged to read the transponder when the power cord is coupled to one of the electrical outlets.

At block 406, information is communicated to a controller. The information may contain the identification data read from the transponder. In another embodiment, the information may contain data including, but not limited to, an electrical outlet identifier, an electrical outlet status, and other data associated with the operation of the PDU. For example, the information may contain data to be used for identifying the asset and a location of the asset based on the data contained in the transponder and in the PDU, such as which outlet the asset is coupled to. The information may also contain additional data to be used for identifying, for example, the properties of the asset (such as power consumption requirements).

At block 408, a control action is determined. The control action may be determined based on the information. For example, the information may be compared to a database containing asset data and a power control configuration associated with the asset. In accordance with the power control configuration, the controller may take a control action such as reporting an alarm, turning the electrical outlet on or off, setting the voltage supplied by the electrical outlet, or setting other power properties. For example, the power control configuration may define a sequence for starting or stopping the asset with respect to other conditions, such as whether the asset is operating on backup power, whether the asset depends upon another device, and time of day restrictions for the asset.

At block 410, process 400 ends.

In one embodiment, the controller affects the control action directly on the asset, or on the electrical outlet. In another embodiment, indicated using dashed lines in FIG. 4, acts 410 and 412 occur subsequent to act 408. At block 410, the controller may communicate the control action to the PDU. At block 412, the PDU controls the electrical outlet based on the control action. The PDU may control the electrical outlet under the direction of the controller, or the PDU may act independently of the controller.

In various other embodiments, indicated using dashed lines in FIG. 4, optional acts 416, 418, 420, and 422 occur after act 406. In one embodiment, at block 416, the asset may be located based on the information. For example, the controller may compare the identification data read from the transponder and the outlet identification with a database to determine a location of the asset. In another embodiment, at block 418, the asset may be identified. For example, the controller may compare the identification data with the database to determine an identity of the asset.

In yet another embodiment, at block 420, a reporting action may be determined. The reporting action may include reporting a status of the asset, a status of the electrical outlet or PDU (e.g., a relay or circuit breaker status), and a power load or power consumption of the asset. The reporting action may involve sending a report or alarm to a user terminal or another device, such as an inventory, billing, load management, or utilization system.

In another embodiment, at block 422, an inventory including the asset may be maintained. The inventory may be maintained in, for example, a database stored within the controller, or in a database stored in another device. The inventory may include information such as asset identification, asset location, asset status, and asset power utilization. Additionally, the inventory may be updated when the asset is removed, or when an unknown or unrecognized asset is added. The inventory may also include data such as a power path map and a power configuration associated with the asset.

The process 400 may also include mapping a power path to the asset (not shown). For example, the controller may associate, in the database, a newly installed asset, which is identified and located based on the information, with the electrical outlet the asset is coupled to. Accordingly, the power control configuration associated with the asset may be automatically applied to the corresponding electrical outlet for controlling power to the asset in accordance with the mapped power path. If the asset is moved to a new electrical outlet, the controller may automatically update the mapped power path to enable the power control configuration to be applied to the asset at the new electrical outlet.

Figure 5:
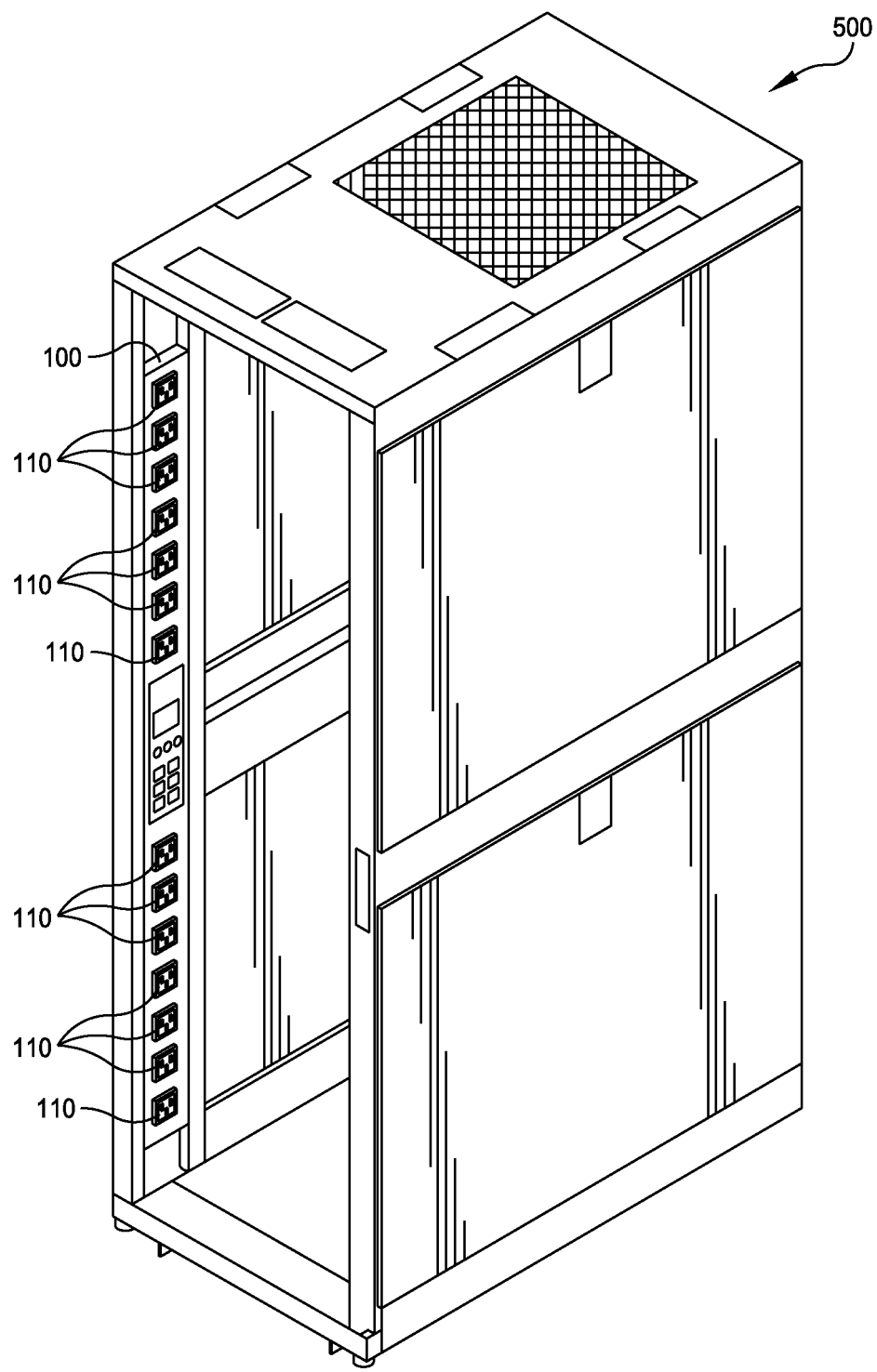
FIG. 5 is a perspective view of an exemplary equipment rack in accordance with one embodiment of the present disclosure.

FIG. 5 depicts an exemplary equipment rack 500 having a PDU 100 mounted therein. The PDU 100 includes a plurality of outlets 110, at least one antenna (not shown) mounted in proximate relation to at least one of the outlets 110, and a reader (not shown) coupled to the antennas. The PDU 100 may further include an antenna switch (not shown) and may be coupled to a controller (not shown). The PDU 100 may further include a communication device (not shown) coupled to the reader. The reader may be configured to read, through one or more of the antennas, identification data contained in a transponder attached to a power cord of an asset, the power cord being coupled to one of the outlets 110. The communication device may communicate information including the identification data between the reader and the controller. The controller may determine a control action based on the information.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

For example, embodiments of the invention may include readers configured to read signals from transponders other than RFID tags, such as optical bar code tags and the like. Embodiments of the invention may include attaching the transponder to the plug of a power cord, embedding the transponder in the plug, or attaching the transponder to the power cord using, for example, a tether. Embodiments of the invention may include utilizing alternative systems and methods of asset identification and management based on the data received from the transponder.

What is claimed is:

1. A method for identifying and managing an asset comprising:
    mounting a power distribution apparatus in an equipment rack, the power distribution apparatus including a reader;
    detecting a change in current at one or more electrical outlets in the power distribution apparatus;
    selectively enabling one or more antennas of a plurality of antennas coupled to the reader in response to detecting the change in current, wherein selectively enabling includes enabling an antenna associated with an electrical outlet at which a change in current is detected;
    reading, by the reader through the one or more antennas, identification data contained in a transponder attached to a power cord of the asset, each of the one or more antennas being mounted in proximate relation to the one or more electrical outlets in the power distribution apparatus, the power cord being coupled to one of the one or more electrical outlets;
    communicating information including the identification data through a network to a controller; and
    determining, by the controller, a control action based on the information.

2. The method set forth in claim 1, further comprising communicating the control action through the network to the power distribution apparatus.

3. The method set forth in claim 2, further comprising controlling the one or more electrical outlets based on the control action.

4. The method set forth in claim 1, wherein the controller includes a database of assets, and wherein the method further comprises comparing the information to the database to identify and/or locate the asset.

5. The method set forth in claim 1, further comprising maintaining an inventory including the asset based on the information.

6. The method set forth in claim 1, further comprising selectively enabling the one or more of the plurality of antennas using an antenna switch coupled to the reader, to enable the reader to read at least the transponder.

7. The method set forth in claim 1, further comprising determining, by the controller, a reporting action based on the information.

8. The method set forth in claim 1, further comprising communicating a user control action through the network to the power distribution apparatus, and controlling the one or more electrical outlets based on the user control action.

9. The method set forth in claim 1, further comprising locating the asset based at least on a location of the equipment rack and the one or more antennas that are selectively enabled.

10. A power distribution apparatus comprising:
a power input to receive input power from a power source;
a plurality of electrical outlets coupled to the power input;
a reader coupled to a plurality of antennas, each antenna constructed and arranged to be mounted in proximate relation to one or more of the plurality of electrical outlets, the reader being configured to read, through one of the plurality of antennas, identification data contained in a transponder attached to a power cord of an asset, the power cord being coupled to one of the one or more electrical outlets;
a communication device coupled to the reader; and
a controller coupled to the communication device,
wherein the power distribution apparatus is operative to detect a change in current at one or more of the plurality of electrical outlets and to selectively enable one or more antennas of the plurality of antennas in response to detecting the change in current, wherein selectively enable includes enable an antenna associated with an electrical outlet at which a change in current is detected; and
wherein the communication device is operative to communicate information including the identification data between the reader and the controller, and
wherein the controller is operative to determine a control action based on the information.

11. The apparatus set forth in claim 10, wherein the controller includes a database of assets to identify and/or locate the asset based on the information.

12. The apparatus set forth in claim 10, wherein the reader includes an RFID reader, and wherein the transponder includes an RFID tag.

13. The apparatus set forth in claim 10, wherein the identification data is user programmable.

14. The apparatus set forth in claim 10, further comprising an antenna selector coupled to each antenna of the plurality of antennas to selectively enable one of the plurality of antennas to enable the reader to read the transponder.

* * * * *